United States Patent
Simmons et al.

(10) Patent No.: US 7,570,533 B1
(45) Date of Patent: Aug. 4, 2009

(54) COMPLETELY TRANSPORTABLE ERASABLE MEMORY APPARATUS AND METHOD

(75) Inventors: Michael Simmons, La Mesa, NM (US); Gregory Cooper, Las Cruces, NM (US); David R. Gorman, Las Cruces, NM (US); Tracy Hooker, Las Cruces, NM (US)

(73) Assignee: Arrowhead Center, Inc., Las Cruces, NM (US)

( * ) Notice: Subject to any disclaimer, the term of this patent is extended or adjusted under 35 U.S.C. 154(b) by 1 day.

(21) Appl. No.: 11/954,578

(22) Filed: Dec. 12, 2007

Related U.S. Application Data

(60) Provisional application No. 60/869,800, filed on Dec. 13, 2006.

(51) Int. Cl.
*G11C 11/00* (2006.01)
(52) U.S. Cl. .................. 365/218; 365/149; 365/154; 713/194
(58) Field of Classification Search ............. 365/185.04
See application file for complete search history.

(56) References Cited

U.S. PATENT DOCUMENTS

| | | | | |
|---|---|---|---|---|
| 4,783,801 | A | | 11/1988 | Kaule |
| 5,053,992 | A | * | 10/1991 | Gilberg et al. ......... 365/185.04 |
| 5,375,246 | A | * | 12/1994 | Kimura et al. ............. 365/229 |
| 5,758,121 | A | | 5/1998 | Fukuzumi |
| 5,956,749 | A | | 9/1999 | Kakihara |
| 6,292,898 | B1 | | 9/2001 | Sutherland |
| 6,633,501 | B2 | | 10/2003 | Wedel |
| 6,920,527 | B2 | | 7/2005 | Coultier et al. |
| 7,020,019 | B2 | | 3/2006 | Salessi et al. |
| 2002/0149264 | A1 | | 10/2002 | Baiardn et al. |
| 2002/0196572 | A1 | | 12/2002 | Bress et al. |
| 2003/0097596 | A1 | | 5/2003 | Muratov et al. |
| 2004/0158674 | A1 | | 8/2004 | Cloutier et al. |
| 2006/0101190 | A1 | | 5/2006 | McLean |
| 2006/0236409 | A1 | | 10/2006 | Kuehnel et al. |
| 2006/0294304 | A1 | | 12/2006 | Brown et al. |

* cited by examiner

*Primary Examiner*—Tan T. Nguyen
(74) *Attorney, Agent, or Firm*—Deborah A. Peacock; Samantha A. Updegraff; Peacock Myers, P.C.

(57) ABSTRACT

The present invention relates to methods and apparatuses for providing data storage which can be completely erased to prevent access to previously stored data.

18 Claims, 2 Drawing Sheets

COMPLETELY TRANSPORTABLE ERASABLE MEMORY APPARATUS AND METHOD

CROSS-REFERENCE TO RELATED APPLICATIONS

This application claims priority to U.S. Provisional Patent Application Ser. No. 60/869,800, entitled "Completely Erasable Transportable Memory," filed on Dec. 13, 2006, and the specification thereof is incorporated herein by reference.

BACKGROUND OF THE INVENTION

1. Field of the Invention (Technical Field)

Embodiments of the present invention preferably relate to providing a data storage apparatus which can be completely erased to prevent others from gaining access to the previously stored data. Particularly, the present invention relates to a readily-transportable, completely-erasable data storage apparatus which can preferably be inserted into a computer's Universal Serial Bus (USB) port, FireWire port, or like I/O port.

2. Description of Related Art

Note that where the following discussion refers to a number of publications by author(s) and year of publication, that due to recent publication dates certain publications are not to be considered as prior art vis-a-vis the present invention. Discussion of such publications herein is given for more complete background and is not to be construed as an admission that such publications are prior art for patentability determination purposes.

Prior art portable memory devices such as USB flash drives or "thumb drives" retain remnants of data even after the device is erased. Accordingly, for secured installations having classified or sensitive data, the policy often employed is that all data that enters the sensitive area will not leave the area. Under this policy, when data is brought onto a secured computer or a secured computer network from such a device, it must be completely destroyed in order to ensure that no sensitive data remains on the device so that no sensitive data can leave the installation. For particularly large installations, physically destroying functional equipment can result in a substantial waste of money and resources. In addition, current flash drives have a write limit that can be quickly exceeded in some applications.

Historically, if an institution wanted absolute control of data, completely separate computer networks would be put into place and strict policies would be implemented to prevent users from moving data across the networks. In the case of extremely sensitive data, a typical user policy would prevent all data from exiting the sensitive area. If data is brought in on a floppy, the internal floppy media is removed from the external casing and shredded. If data is brought in on CD recordable media, the CD is ground up. Computer disk drives or non-volatile memory drives are also destroyed. Hard drives that once contained sensitive information are never released from a positively controlled area until the platters of the drives have been heated to the point where the magnetic material realigns with the Earth's magnetic field. Non-volatile drives such as USB flash drives are treated exactly the same.

These practices ensure that no sensitive data can leave the sensitive network, but brings an added expense because it produces a one-way flow of computer storage media toward the sensitive network with no chance of recycling. Over time and for large quantities of data, this practice is expensive and wasteful.

U.S. Patent Application Publication No. 2002/0196572 to Bress et al., entitled "Systems and Methods For Removing Data Stored On Long-Term Memory Devices," issued Dec. 26, 2002, discloses a device for removing data from a traditional long-term non-volatile memory component. A user-controlled switch causes the control circuit to commence permanently removing data.

U.S. Pat. No. 6,292,898 to Sutherland, entitled "Active Erasure Of Electronically Stored Data Upon Tamper Detection," issued Sep. 18, 2001, discloses an intrusion-detection system for protecting data in a volatile data storage device.

U.S. Patent Application Publication No. 2006/0236409 to Kuehnel et al. entitled "Volatile Portable Memory," issued Oct. 19, 2006, discloses a timed erasure mechanism to be used with portable computer readable media consisting of volatile memory storing specific purpose data (keys).

U.S. Patent Application Publication No. 2002/0149264 to Baiardo et al. entitled "Method And Apparatus For Retaining Programming In A Volatile Memory Unit," issued Oct. 17, 2002 discloses a portable power supply removably connectable to a circuit board consisting of a volatile memory unit used in testing of the volatile memory unit.

There is thus a need for a method, apparatus, and/or system which provides an easily transportable data storage apparatus which can be quickly and permanently erased. There is further a need for a data storage apparatus which is readily transportable and additionally which does not have a write limit that is quickly exceeded.

BRIEF SUMMARY OF THE INVENTION

The present invention is of a method (and concomitant apparatus) for temporarily storing and transporting data, comprising: providing a portable housing; employing volatile memory to store general purpose data without accompanying backup non-volatile memory; powering the volatile memory with an internal power supply; and erasing the volatile memory by operation of a discharger; and wherein the volatile memory retains no trace of previously stored data after operation of the discharger.

In the preferred embodiment, the volatile memory comprises random access memory, and the discharger preferably comprises a button or switch, and most preferably one or more of a power switch, a toggle switch, or a dead man's switch. Interfacing with a standard computer system is done via an external connector and concomitant controller. A status indicator shows highest security classification level of computers to which the volatile memory has been connected since last operation of the discharger (such as from the set including standard, unclassified, restricted, confidential, secret, and top secret). The status indicator comprises a method of manually or automatically displaying the classification of data on one or more display apparatuses, including but not limited to one or more of manual slide indicators, a series of light emitting diodes with labels, full language descriptions on light emitting diode panels, liquid crystal displays, or the like. The power supply preferably comprises a battery (rechargeable or non-rechargeable).

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Figure 1:
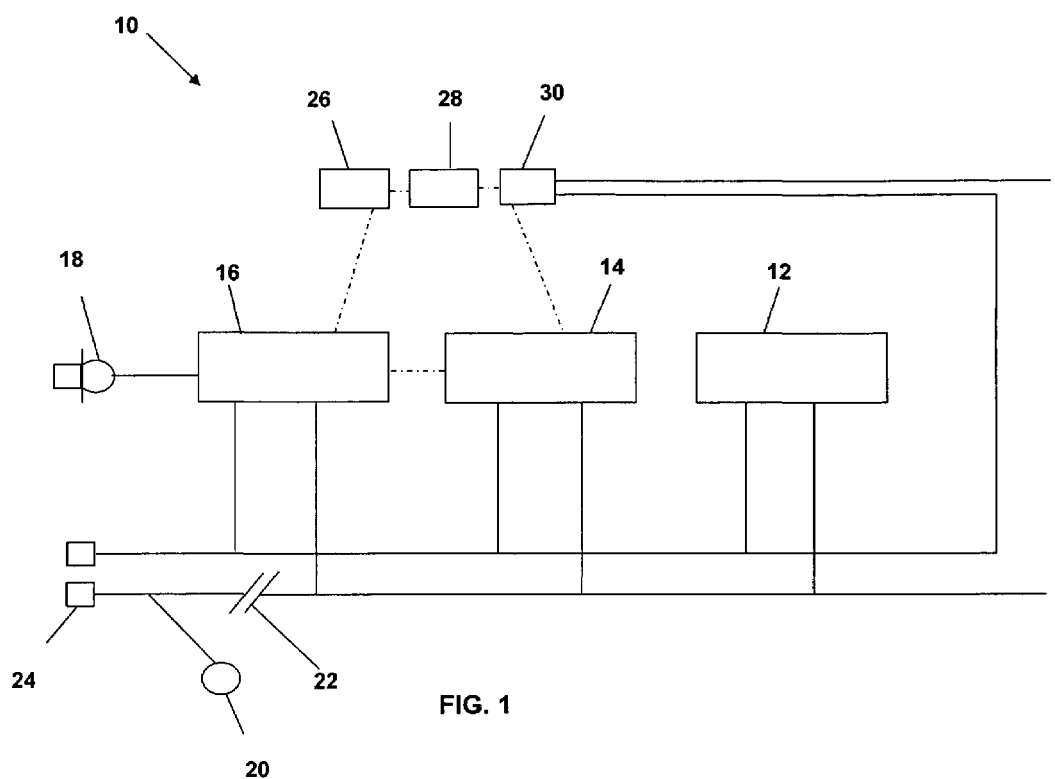
FIG. 1 is a drawing illustrating a block diagram of an embodiment of the present invention.

Embodiments of the present invention are directed to an apparatus and method for easily and completely erasing stored data such that the erasure cannot subsequently be subverted and thus the data or significant portions of the data cannot be recovered, including but not limited to data stored on USB drives or other memory storage devices.

As used in the specification and claims herein, the terms "a", "an", and "the" mean one or more.

As used throughout this application, the following terms have the following meanings throughout the specification and claims:

The term "volatile memory" means memory that does not hold its contents without power.

The term "non-volatile memory" refers to memory chips that hold their content without power being applied. It may refer to chips that are not changeable, such as ROMs and PROMs, or to chips that can be rewritten many times such as flash memory, or the like.

"USB drive" is also known as a "flash drive," "pen drive," "keychain drive," "key drive," "USB key," "USB stick," and "memory key." Numerous brand names have also been coined, such as Lexar's JumpDrive and Trek 2000 International's ThumbDrive, and means a flash memory card that plugs into the computer's USB port, that is small enough to hook onto a keychain, and emulates a small disk drive and allows data to be easily transferred from one machine to another, or the like.

The term "RAM" means random access memory which is a type of memory chip that is "byte addressable" and provides direct access to any location on the chip. The contents of any byte can be read or written without regard to the bytes before or after it.

The term "SRAM" means static RAM and is a fast memory technology that requires power to hold its content. SRAM is used for high-speed registers, caches and relatively small memory banks such as a frame buffer on a display adapter. In contrast, the main memory in a computer is typically dynamic RAM (DRAM, D-RAM). Static RAM chips have access times in the 10 to 30-nanosecond range, while dynamic RAM is usually above 30 ns. Bipolar and ECL memories are under 10 ns.

The term "discharger" is used in the broadest sense and thus includes but is not limited to a device that causes the release of stored energy or electric charge from a battery, or the like.

An embodiment of the present invention preferably relates to a memory-storage apparatus, preferably a universal serial bus (USB) storage apparatus or optionally any other memory-storage apparatus or the like. An embodiment of the present invention preferably uses volatile Random Access Memory (RAM) as opposed to using flash-memory-based USB storage technology. The present invention preferably comprises RAM sticks such as those currently used in standard personal computers.

Embodiments of the present invention preferably erase data by direct user manipulation, power supply exhaustion, or any other method of erasure.

The present invention is inherently different from non-volatile memory storage devices that retain data after power is removed and where traces of the retained data can be recovered after data "deletion." Preferably, in embodiments of the present invention, methods of deletion comprise fundamental properties of the volatile memory, unlike traditional devices that use traditional overwriting methods. When electrical power is removed from the preferred embodiments of the present invention, all traces of data are removed. Furthermore, unlike traditional devices based on flash memory that use wear leveling algorithms, embodiments of the present invention do not comprise a write limitation.

Embodiments of the present invention comprise configurations compatible with traditional software devices and methods, and thus are less expensive, more flexible, and easier to use.

Embodiments of the present invention further comprise capabilities to monitor and/or control any type of information or file type, with no restrictions. Embodiments of the present invention are used in secure environments such as in industry, government, academia or the like.

Embodiments of the present invention preferably comprise a method for discharging memory, including but not limited to a general power switch, a dedicated erasure switch comprising toggles, or the like. The present invention preferably comprises an internal power supply including but not limited to a battery, a capacitor, a rechargeable battery, or the like.

The present invention preferably comprises a standard physical external connection for compatibility with standard computers, including but not limited to a USB, FireWire, or the like.

The present invention preferably interfaces with a host computer to monitor security levels including but not limited to "standard," "sensitive," "unclassified," "confidential," or "secret." The apparatus comprises an indication system that monitors and subsequently indicates the security level of the host computer on a LED or LCD, and remembers the highest security level of the computer it interfaces since powered on. Embodiments of the present invention keep track of sensitivity levels detected and control the flow of data between sensitivity levels. Embodiments of the present invention preferably interface with but alternately are not integrated with the security level monitoring system. The apparatus comprises an indication system comprised of software on a computer and a hardware support that detect and subsequently display the security level of the host computer on a status indicator that preferably comprises a LED or LCD status indicator, and remembers the highest security level of the computer it interfaces since powered on. The status system can be implemented as either a status monitor supplement or built into the bus interface controller. Embodiments of the present invention preferably comprise an data status sensitivity indicator or a data blocker that blocks transfer of data from higher ranked sensitivity levels to lower levels.

Another embodiment of the present invention preferably comprises unlimited write capacity, preferably stores general purpose data in large quantities, is reusable, and is recyclable.

The present invention provides persons wishing to transport secure data to and/or from a site with the ability to do so while also easily, quickly, and permanently erasing the data stored thereon when the user so desires. An embodiment of the present invention preferably employs volatile RAM, whereby the data storage apparatus of the present invention can be re-written an almost unlimited number of times.

The present invention preferably comprises a computer connection, such as a USB connection, a computer connection, such as a USB connection, controller interface, a memory controller, a volatile memory device, a battery, and an easily accessible switch that removes power from the present invention. The present invention also comprises a computer connection status system that gathers the sensitivity level of the computer that the invention is connected to and displays the highest level that it has been connected to since being powered on. This system can be comprised of, but is not limited to, a single controller chip. The status system may or may not also connect to the controller interface and memory interface to disallow data flow if the system is connected to a system of unknown or lower sensitivity level.

Applications of the present invention preferably include computer data storage similar, but superior to, USB flash drives because the present invention solves two immediate but separate problems. Typical flash-based memory systems retain remnants of past information after re-writing and after power loss, which makes their use when transferring data from unclassified to classified systems problematic from a regulatory standpoint. Volatile RAM that does not have data retention after power removal is preferred when used in sensitive computer networks to prevent "data pollution."

As illustrated in FIG. 1, erasable data storage apparatus 10 preferably uses volatile random access memory (RAM) or alternately uses SRAM, DRAM 12, in conjunction with volatile memory controller 14, interface controller 16, computer connector 18, power indicator 20, switch 22, and power supply 24. Status monitor 26 receives update on data classification via computer connector 18, passes data classification information to status indicator 28 which displays data classification. Status controller 30 blocks or transfers data after it requests and receives data classification information from status indicator 28. Those skilled in the art will readily recognize that power indicator 20, as well as computer connector 18, is not required in order for embodiments of the present invention to provide desirable results.

In the most preferred embodiment, data preferably passes to and from data storage apparatus 10 via computer connector 18 which is powered by interface controller 16. Data is preferably stored onto and/or removed from volatile RAM 12 via volatile memory controller 14. Power indicator 20, interface controller 16, volatile memory controller 14, and volatile RAM 12 are preferably powered by power source 24. Switch 22 is optionally provided such that power source 24 can be connected and/or disconnected from the various components. Status controller 30, status monitor 26, and status indicator 28 enable computer to monitor security levels of data.

Those skilled in the art will readily recognize that alternative configurations and/or placements of the various components of embodiments of the present invention can be made while still maintaining one or more advantages of the present invention. For example, power source 24 can be wired to the various components such that it is in an "always on" configuration, and switch 22 can simply bridge a power input pin of volatile RAM to ground. As such, when a user closes switch 22, the voltage of the power input pin or volatile RAM will thus be reduced to ground.

Figure 2:
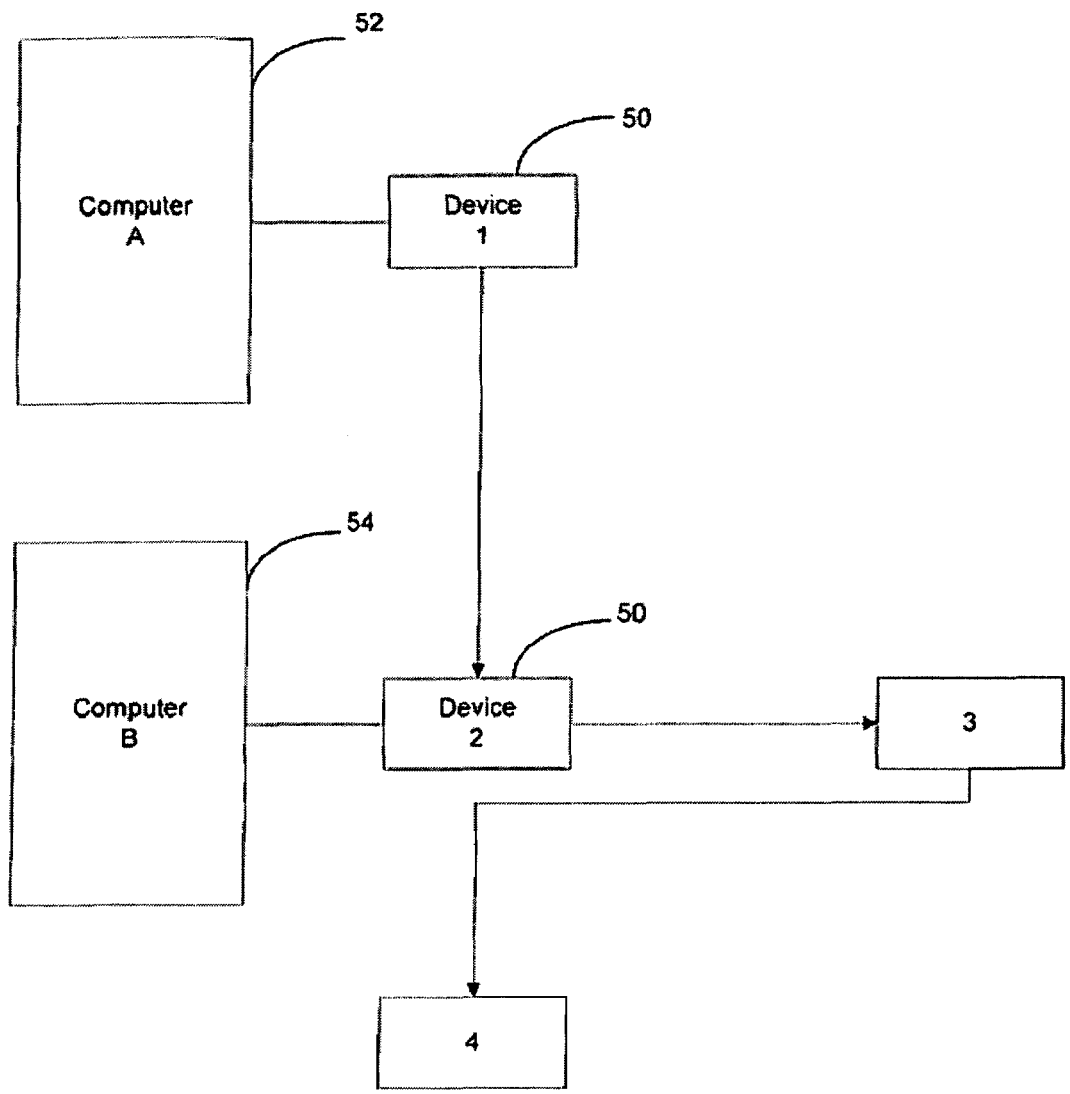
FIG. 2 is a drawing illustrating a block diagram of how an embodiment of the present invention is preferably employed.

In another embodiment, as illustrated in FIG. 2, completely erasable data storage apparatus 50 is connected to computer 52 and data therefrom is stored onto apparatus 50. Data storage apparatus 50 is then connected to computer 54 and at least some of the data from apparatus 50 is stored onto computer 54. Data storage apparatus 50 is then preferably removed from computer 54 and the data remaining on Data storage apparatus 50 is then preferably permanently erased therefrom. Data from Data storage apparatus 50 is preferably permanently removed therefrom by activating switch 22 of FIG. 1. After data from Data storage apparatus 50 has been permanently removed, Data storage apparatus 50 can then be reused with no adverse effects of the permanent removal of the data.

Although the invention has been described in detail with particular reference to these preferred embodiments, other embodiments can achieve the same results. Variations and modifications of the present invention will be obvious to those skilled in the art and it is intended to cover all such modifications and equivalents. The entire disclosures of all references, applications, patents, and publications cited above and/or in the attachments, and of the corresponding application(s), are hereby incorporated by reference.

What is claimed is:

1. An apparatus for temporarily storing and transporting data, said apparatus comprising a portable housing containing:
   volatile memory storing general purpose data without accompanying backup non-volatile memory;
   an internal power supply;
   a discharger; and
   a status indicator showing highest security classification level of computers to which said apparatus has been attached since last operation of said discharger;
   wherein said volatile memory retains no trace of previously stored data after operation of said discharger.

2. The apparatus of claim 1 wherein said volatile memory comprises random access memory.

3. The apparatus of claim 1 wherein said discharger comprises a button or switch.

4. The apparatus of claim 3 wherein said button or switch comprises a member selected from the group consisting of a power switch, a toggle switch, and a dead man's switch.

5. The apparatus of claim 1 additionally comprising an external connector and concomitant controller compatible with standard computer systems.

6. The apparatus of claim 1 wherein said classification levels comprise standard, unclassified, restricted, confidential, secret, and top secret.

7. The apparatus of claim 1 wherein said status indicator comprises one or more display devices.

8. The apparatus of claim 7 wherein said one or more display devices are selected from the group consisting of light emitting diodes and liquid crystal displays.

9. The apparatus of claim 1 wherein said power supply comprises a battery.

10. A method for temporarily storing and transporting data, the method comprising the steps of:
   providing a portable housing;
   employing volatile memory to store general purpose data without accompanying backup non-volatile memory;
   powering the volatile memory with an internal power supply;
   erasing the volatile memory by operation of a discharger; and providing a status indicator showing highest security classification level of computers to which the volatile memory has been connected since last operation of the discharger;

wherein the volatile memory retains no trace of previously stored data after operation of the discharger.

11. The method of claim 10 wherein the volatile memory comprises random access memory.

12. The method of claim 10 wherein the discharger comprises a button or switch.

13. The method of claim 12 wherein the button or switch comprises a member selected from the group consisting of a power switch, a toggle switch, and a dead man's switch.

14. The method of claim 10 additionally comprising interfacing with a standard computer system via an external connector and concomitant controller.

15. The method of claim 10 wherein the classification levels comprise standard, unclassified, restricted, confidential, secret, and top secret.

16. The method of claim 10 wherein the status indicator comprises one or more display devices.

17. The method of claim 16 wherein the one or more display devices are selected from the group consisting of light emitting diodes and liquid crystal displays.

18. The method of claim 10 wherein the power supply comprises a battery.

* * * * *